United States Patent [19]
Daly

[11] Patent Number: 4,997,103
[45] Date of Patent: Mar. 5, 1991

[54] SLIDING DOOR

[75] Inventor: John J. Daly, San Carlos, Calif.

[73] Assignee: GRiD Systems Corporation, Fremont, Calif.

[21] Appl. No.: 544,810

[22] Filed: Jun. 26, 1990

Related U.S. Application Data

[63] Continuation of Ser. No. 364,923, Jun. 12, 1989, abandoned.

[51] Int. Cl.[5] .............................................. B65D 43/20
[52] U.S. Cl. ................................... 220/346; 220/350; 220/345; 206/1.5
[58] Field of Search ............... 220/350, 345, 346, 347, 220/348, 351; 222/559, 561; 206/1.5

[56] References Cited

U.S. PATENT DOCUMENTS

| | | | |
|---|---|---|---|
| 358,450 | 3/1897 | Hurlbut | 220/346 |
| 2,089,812 | 8/1937 | Seidel | 220/346 |
| 3,016,170 | 1/1962 | Merkel | 222/561 |
| 3,362,564 | 1/1968 | Mueller | 220/346 |
| 3,525,117 | 8/1970 | Robinson | 49/197 |
| 3,651,979 | 3/1976 | Severson | 220/346 |
| 3,832,025 | 8/1974 | Artner et al. | 312/297 |
| 3,938,690 | 2/1976 | Butler | 220/348 |
| 4,062,445 | 12/1977 | Moe | 206/538 |
| 4,303,172 | 12/1981 | Bosland | 220/346 |
| 4,408,346 | 10/1983 | Bauer | 455/175 |
| 4,618,070 | 10/1986 | Huckle | 220/350 |
| 4,752,539 | 6/1988 | Vatter | 220/348 |
| 4,842,138 | 6/1989 | Sandel et al. | 220/346 |

Primary Examiner—David T. Fidei
Attorney, Agent, or Firm—Townsend & Townsend

[57] ABSTRACT

This invention relates to a component door assembly for an electronic device which hides and protects removable electronic components. The door has separate locking and moving mechanisms so that two operations must be performed before the door can be opened. Specifically, in the preferred embodiment a resilient sliding door is mounted on tracks or grooves in the housing of an electronic device. The door has a button on one end and a handle on the other end. To open the door, the button is pressed inward while the handle is pulled in the direction of the button.

4 Claims, 1 Drawing Sheet

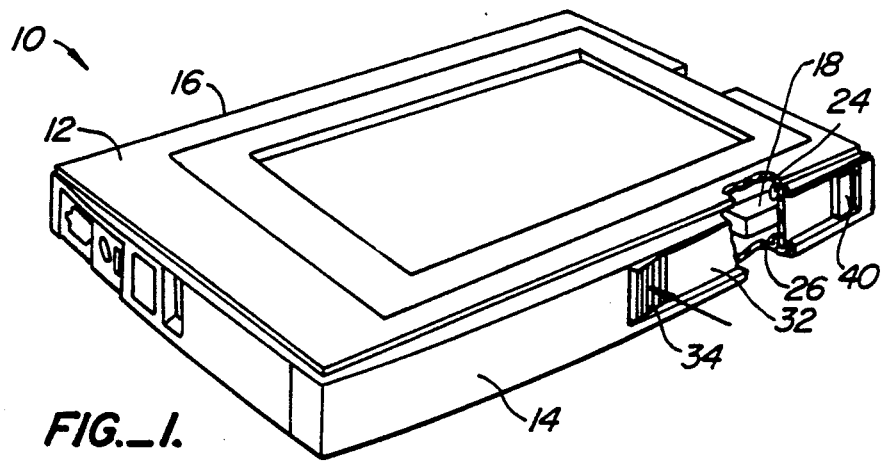
FIG._1.
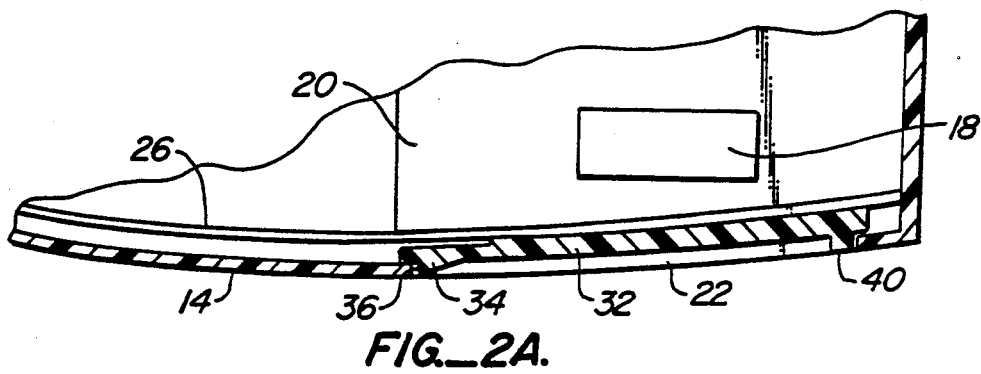
FIG._2A.
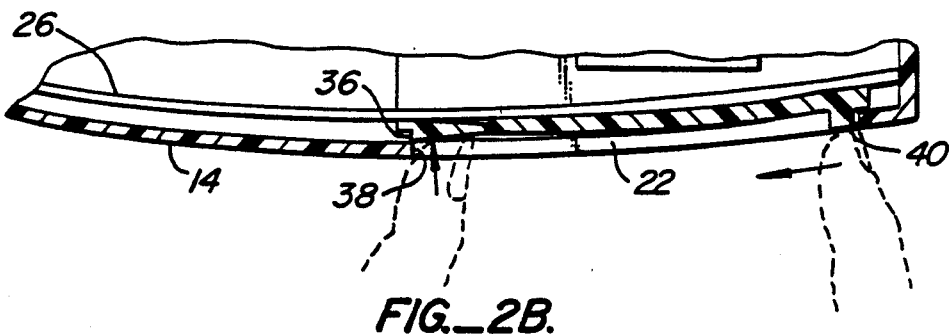
FIG._2B.
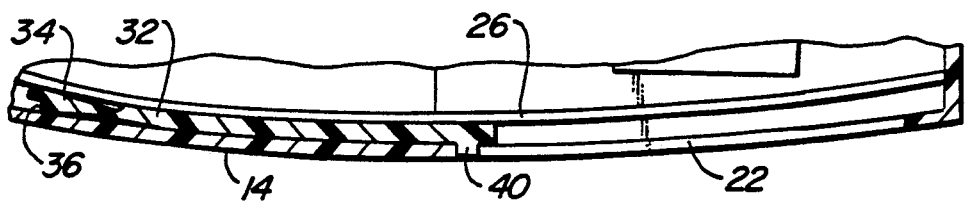
FIG._2C.

SLIDING DOOR

This is a continuation of Ser. No. 364,923, filed 6/12/89, now abandoned.

BACKGROUND OF THE INVENTION

This invention relates generally to latches for sliding doors and in particular for sliding doors on computer equipment.

Electronic devices typically have components which may be removed and replaced in the normal course of the device's operation. The housings for these devices must therefore provide the user easy access to the removable components. This invention is directed to a method and apparatus for providing access to electronic equipment components.

SUMMARY OF THE INVENTION

One problem with some prior art electronic equipment access doors is the ease with which they may be accidentally opened. The electronic components contained by these devices are usually fragile and easily damaged. In addition, movement of the components during operation of the device or while the device's power is on may damage the device, the component, or both. What is needed, therefore, is a door to cover these components.

Furthermore, while the electronic components may be appropriately removed by a qualified technician or repairperson, the device manufacturer may want to discourage the removal of the components by an ordinary user. The door therefore, should have a mechanism that discourages casual opening of the door or removal of the protector.

This invention meets these and other needs by providing a component door assembly for an electronic device which hides and protects removable electronic components. The door has separate locking and moving mechanisms so that two operations must be performed before the door can be opened. Specifically, in the preferred embodiment a resilient sliding door is mounted on tracks or grooves in the housing of an electronic device. The door has a button on one end and a handle on the other end. To open the door, the button is pressed inward while the handle is pulled in the direction of the of the button.

BRIEF DESCRIPTION OF THE DRAWINGS

FIG. 1 shows an elevational view and a partial sectional view of the preferred embodiment of this invention;

FIG. 2A shows a sectional view of the door in its closed state;

FIG. 2B shows a sectional view of the door with the button depressed; and

FIG. 2C shows a sectional view of the door in its open state.

DETAILED DESCRIPTION OF THE PREFERRED EMBODIMENT

An electronic device 10 having a housing 12 is shown in FIG. 1. In the preferred embodiment, housing 12 has curved sides 14 and 16, although this shape is not critical to the invention. One or more electronic components 18 are disposed in a space 20 within housing 12. An opening or port 22 is formed in side 14 of housing 12 adjacent the electronic components 18. Port 22 provides access to the interior of housing 12.

Top and bottom tracks 24 and 26 are formed in the inside surface 28 of the top of housing 12 and in the inside surface 30 of the bottom of housing 12, respectively. Tracks 24 and 26 follow the contours of side 14. A flexible door 32 is mounted in top track 24 and bottom track 26. In the preferred embodiment, door 32 is slightly smaller than opening 22 and is disposed within housing 12.

A raised button 34 is formed on door 32. Surface 36 of button 34 is adjacent and substantially parallel to surface 38 of housing 12 when door 32 is in the closed position. A handle 40 is formed on door 32 on the end of door 32 opposite button 34.

To open door 32, button 34 is pressed inward, i.e., toward the interior of housing 12, thereby bending flexible door 32. Simultaneously, handle 40 is pulled in the direction of button 34 so that door 32 moves to the left as shown in FIGS. 2B and 2C. The distance between button 34 and handle 40 requires this simultaneous operation to be performed by two different fingers of one hand or by two hands, thereby minimizing the chances of inadvertent opening of the door.

As door 32 moves, button 34 disappears behind side 14 of housing 12. The leftward movement of door 32 is limited by the interaction of handle 40 with surface 38. Opening door 32 exposes the components 18 mounted within housing 12 adjacent door 32 so that the components may be removed and/or replaced.

To close door 32, handle 40 is pulled to the right. When door 32 reaches its rightward limit of movement, the spring action of flexible door 32 will move button 34 forward so that surface 36 of button 34 is once again adjacent and substantially parallel to surface 38 of housing 12.

I claim:

1. A housing structure comprising:
   a housing having an interior portion;
   a port for providing access to said housing interior portion, said port having an abutment edge; and
   a slidable door for selectively covering and uncovering the port, said door having a flexible elongate main body portion, a first end and a second end,
   said elongate main body portion having a relatively uniform thickness along the length thereof and opposing side edges slidably received in grooves disposed on the housing,
   said first end including means for enabling a first applied external force to slide the door along the grooves,
   said second end having means for releasably locking the door against sliding movement, said locking means including an abutment member engageable with said port abutment edge, said abutment member having a thickness less than the thickness of said main body portion and being resiliently arranged with respect to said main body portion so that said abutment member normally contacts said port abutment edge when said door is in a closed position to prevent the sliding movement in a first direction and so that said abutment member flexes inwardly toward said housing interior portion when a second external force is applied thereto to thereby unlock said door for sliding movement.

2. The invention of claim 1 wherein said abutment member has a stepped edge and a tapered cross section of diminishing thickness from said second end toward said main body portion.

3. The invention of claim 1 wherein said grooves are curved.

4. The invention of claim 1 wherein said enabling means comprises an externally extending protrusion, and wherein said housing port has a second abutment edge engageable with said protrusion to provide a sliding motion limit stop for said door.

* * * * *